(12) United States Patent
Straw et al.

(10) Patent No.: US 8,168,961 B2
(45) Date of Patent: May 1, 2012

(54) CHARGED PARTICLE BEAM MASKING FOR LASER ABLATION MICROMACHINING

(75) Inventors: Marcus Straw, Portland, OR (US);
Milos Toth, Portland, OR (US); Steven Randolph, Portland, OR (US); Michael Lysaght, Tigard, OR (US); Mark Utlaut, Scappoose, OR (US)

(73) Assignee: FEI Company, Hillsboro, OR (US)

( * ) Notice: Subject to any disclaimer, the term of this patent is extended or adjusted under 35 U.S.C. 154(b) by 371 days.

(21) Appl. No.: 12/324,296

(22) Filed: Nov. 26, 2008

(65) Prior Publication Data
US 2010/0127190 A1  May 27, 2010

(51) Int. Cl.
*G21G 5/00* (2006.01)
(52) U.S. Cl. ............... 250/492.3; 250/492.1; 250/492.2; 250/492.22
(58) Field of Classification Search ........... 250/492.1, 250/492.2, 492.22, 492.3; 430/5
See application file for complete search history.

(56) References Cited

U.S. PATENT DOCUMENTS

| | | | |
|---|---|---|---|
| 3,832,948 A * | 9/1974 | Barker | 101/401.1 |
| 4,609,809 A | 9/1986 | Yamaguchi et al. | |
| 4,874,947 A | 10/1989 | Ward et al. | |
| 4,877,480 A * | 10/1989 | Das | 216/51 |
| 5,083,033 A | 1/1992 | Komano et al. | |
| 5,221,422 A * | 6/1993 | Das et al. | 216/57 |
| 5,818,628 A | 10/1998 | Clark et al. | |
| 5,821,549 A | 10/1998 | Talbot et al. | |
| 5,894,058 A | 4/1999 | Hatakeyama et al. | |
| RE37,585 E | 3/2002 | Mourou et al. | |
| 6,582,857 B1 * | 6/2003 | Flanigan et al. | 430/5 |
| 6,753,538 B2 * | 6/2004 | Musil et al. | 250/492.2 |
| 6,818,908 B2 | 11/2004 | Makimura | |
| 6,977,386 B2 | 12/2005 | Gerlach et al. | |
| 7,504,182 B2 | 3/2009 | Stewart et al. | |
| 7,662,524 B2 | 2/2010 | Stewart et al. | |
| 2004/0113097 A1 * | 6/2004 | Marchman et al. | 250/492.2 |
| 2004/0151991 A1 | 8/2004 | Stewart et al. | |
| 2005/0173631 A1 | 8/2005 | Ray et al. | |
| 2008/0314871 A1 * | 12/2008 | Toth et al. | 216/48 |

FOREIGN PATENT DOCUMENTS

JP  59104287  6/1984

OTHER PUBLICATIONS

Orloff, Jon, Handbook of Charged Particle Optics, 1997, pp. 447-453, CRC Press LLC.
Epifanov, Alexandre S., and Sergei V. Garnov, Statistical Approach to Theory of Electron-Avalanche Ionization in Solids, Oct. 10, 1981, pp. 2023-2026, IEEE Journal of Quantum Electronics, vol. QE-17, No. 10.

(Continued)

*Primary Examiner* — Michael Maskell
(74) *Attorney, Agent, or Firm* — Scheinberg & Griner, LLP; Michael O. Scheinberg; Robert J. Amedeo

(57) ABSTRACT

An improved method for substrate micromachining. Preferred embodiments of the present invention provide improved methods for the utilization of charged particle beam masking and laser ablation. A combination of the advantages of charged particle beam mask fabrication and ultra short pulse laser ablation are used to significantly reduce substrate processing time and improve lateral resolution and aspect ratio of features machined by laser ablation to preferably smaller than the diffraction limit of the machining laser.

21 Claims, 5 Drawing Sheets

OTHER PUBLICATIONS

Ajit P. Joglekar et al., Optics at Critical Intensity: Applications to Nanomorphing, Apr. 20, 2004, pp. 5856-5861, PNAS, vol. 101, No. 16.

C. Lu et al., End Point Detection in Ion Milling Processes by Sputter-induced Optical Emission Spectroscopy, Apr. 1984, pp. 481-484, Journal of Vacuum Science Technology, vol. 2, Issue 2.

M. Paniccia et al., Novel Optical Probing and Micromachining Techniques for Silicon Debug of Flip Clip Packaged Microprocessors, 1999, pp. 27-34, Microelectronic Engineering 46.

Ehrlich, Daniel, et al., : Laser Etching for Flip-Chip de-bug and Inverse Stereolithography for MEMS, Solid State Technology, Jun. 2001, pp. 145-150.

Ehrlich, D.J., et al., "Laser Chemical Technique for Rapid Direct Writing of Surface Relief in Silicon," Appl. Phys. Lett., Jun. 15, 1981, pp. 1018-1020, vol. 38, No. 12.

Guo, Hongping, et al., "Study of Gas-Stream-Assisted Laser Ablation of Copper," Thin Solid Films, 1992, pp. 274-276, vol. 218.

Lalev, G., et al., "Template Fabrication Incorporating Different Length Scale Features," Multi-Material Micro Manufacture, 2008.

* cited by examiner

CHARGED PARTICLE BEAM MASKING FOR LASER ABLATION MICROMACHINING

TECHNICAL FIELD OF THE INVENTION

The present invention relates generally to fabricating microstructures, and more particularly, to laser micromachining.

BACKGROUND OF THE INVENTION

Removing material from a substrate to form microscopic or nanoscopic structures is referred to as micromachining, milling, or etching. Lasers beams and charged particle beams are two particular technologies used for micromachining. Each has advantages and limitations in various applications.

Laser systems use several different mechanisms for micromachining. In some processes, the laser is used to supply heat to a substrate to induce a chemical reaction. The reaction occurs only in the heated areas. The heat tends to diffuse to an area larger than the laser beam spot, making the resolution of the process poorer than the laser spot size. Another mechanism used in laser micromachining is photochemical etching, in which the laser energy is absorbed by individual atoms or molecules of the substrate, exciting them into a state in which they can chemically react with an etchant. Photochemical etching is limited to materials that are photochemically active. Another mechanism used in laser machining is laser ablation, in which energy supplied rapidly to a small volume causes atoms to be expelled from the substrate without heating the substrate. Laser ablation using a fast-pulsed, femtosecond laser is described, for example, in U.S. Re. 37,585 to Mourou for "Method for Controlling Configuration of Laser Induced Breakdown and Ablation." Femtosecond laser ablation overcomes some of the limitations of the processes described above.

Charged particle beams include ion beams and electron beams. Ions in a focused beam typically have sufficient momentum to micromachine by physically ejecting material from a surface. Because electrons are much lighter than ions, electron beams are typically limited to removing material by inducing a chemical reaction between an etchant vapor and the substrate. Ions beams typically are generated from a liquid metal ion source or by a plasma ion source. The spot size of a charged particle beam depends on many factors, including the type of particles and the current in the beam. A beam with low current can typically be focused to a smaller spot and therefore produce a smaller structure than a beam with high current, but a low current beam takes longer to micromachine a structure than a high current beam.

Lasers are typically capable of supplying energy to a substrate at a much higher rate than charged particle beams, and so lasers typically have much higher material removal rates than charged particle beams. The wavelength of lasers, however, is much larger than the wavelength of the charged particles in the charged particle beams. Because the size to which a beam can be focused is, in part, limited by the beam wavelength, the minimum spot size of a laser beam is typically larger than the minimum spot size of a charged particle beam. A. P. Joglekar et al, in "Optics at critical intensity: Applications to Nanomorphing," *Proceedings of the National Academy of Science*, vol. 101, no. 16, pp. 5856-5861 (2004) ("Joglekar et al.") shows that features smaller than the wavelength can be achieved using laser pulses shorter than about 10 picoseconds near the critical intensity for ablation The impact of small deviations in pulse energy on the resulting feature makes this process difficult to repeat consistently.

While a charged particle beam typically has greater resolution than a laser beam and can micromachine an extremely small structure, the beam current is limited and the micromachining operation can be unacceptably slow. Laser micromachining, on the other hand, is generally much faster, but the resolution is inherently limited by the longer beam wavelength.

One way to take advantage of both the faster micromachining capability of lasers and the higher precision of charged particle beams is to sequentially process a sample. Sequential processing is described, for example, by M. Paniccia et al. in "Novel Optical Probing and Micromachining Techniques for Silicon Debug of Flip Chip Packaged Microprocessors," *Microelectronic Engineering* 46 (pp. 27-34 1999) ("Paniccia"). Paniccia et al. describe a known technique for accessing the active portion of a semiconductor flip chip using laser-induced chemical etching to remove the bulk of material, and then using a charged particle beam for the final, more precise micromachining. A problem with sequential processing is determining when to stop the faster, less precise laser micromachining and to begin the more precise charged particle beam processing. If the laser processing is stopped too soon, excess material will remain for removal by the charged particle beam. If the laser processing is stopped too late, the work piece will be damaged. Determining when to stop processing is referred to as "endpointing." While there are several known methods for detecting when a micromachining process cuts through a first material to expose a second material, it is typical to stop laser processing before a change in material is reached, and so determining the end point is more difficult.

While sequential processing—laser processing a sample followed by particle beam processing—has its advantages, there remain problems of the endpointing and of the relatively low resolution of the original laser processing.

SUMMARY OF THE INVENTION

An object of the invention is to provide an improved method for laser processing.

A preferred embodiment includes providing a mask through which a sample is exposed to a laser beam. The mask is fabricated through processes that provide a higher mask resolution than is typically achievable through conventional laser beam processing, thereby allowing for higher resolution processing of the sample than would be possible by laser processing without the mask.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Although those of ordinary skill in the art will readily recognize many alternative embodiments, especially in light of the illustrations provided herein, this detailed description is exemplary of the preferred embodiments of the present invention, the scope of which is limited only by the appended claims.

Preferred embodiments of the present invention fabricate a high resolution mask through a process such as charged particle beam processing. The work piece is subsequently exposed to a laser beam through the mask, the mask blocking or restricting portions of the work piece to the laser beam exposure. The mask is preferably fabricated directly on the work piece surface. The terms "work piece," "sample," and "specimen" are used interchangeably in this application.

In one preferred embodiment, the mask is deposited directly onto the work piece surface using charged particle beam-induced deposition. An ultra short laser pulse is then directed toward the work piece surface. Because the diameter of the laser beam is typically greater than the feature size of the mask, the laser beam will impact both the masked and unmasked areas, but due to the difference in the ablation threshold of the mask material and the ablation threshold of the sample, the effects of the laser beam on the work sample will be different on the masked area than on the unmasked area. This difference is used to create structures. Because the resolution of the created features depends on the resolution of the mask, embodiments of the present invention typically provide for fabrication of features having improved lateral resolution and aspect ratios compared to conventional laser micromachining.

Some embodiments of the present invention can be performed using an apparatus that includes a charged particle beam column and a laser system, both of which direct beams to a sample in a vacuum chamber, the beams preferably being approximately coincident. A single system that includes both a laser source and a charged particle beam source in U.S. patent application Ser. No. 10/664,247, assigned to FEI Company of Hillsboro, Oreg., the assignee of the present invention. In other embodiments the mask can be applied in one system, and the laser processing, which does not require a vacuum, can be performed in a different system.

Figure 1:
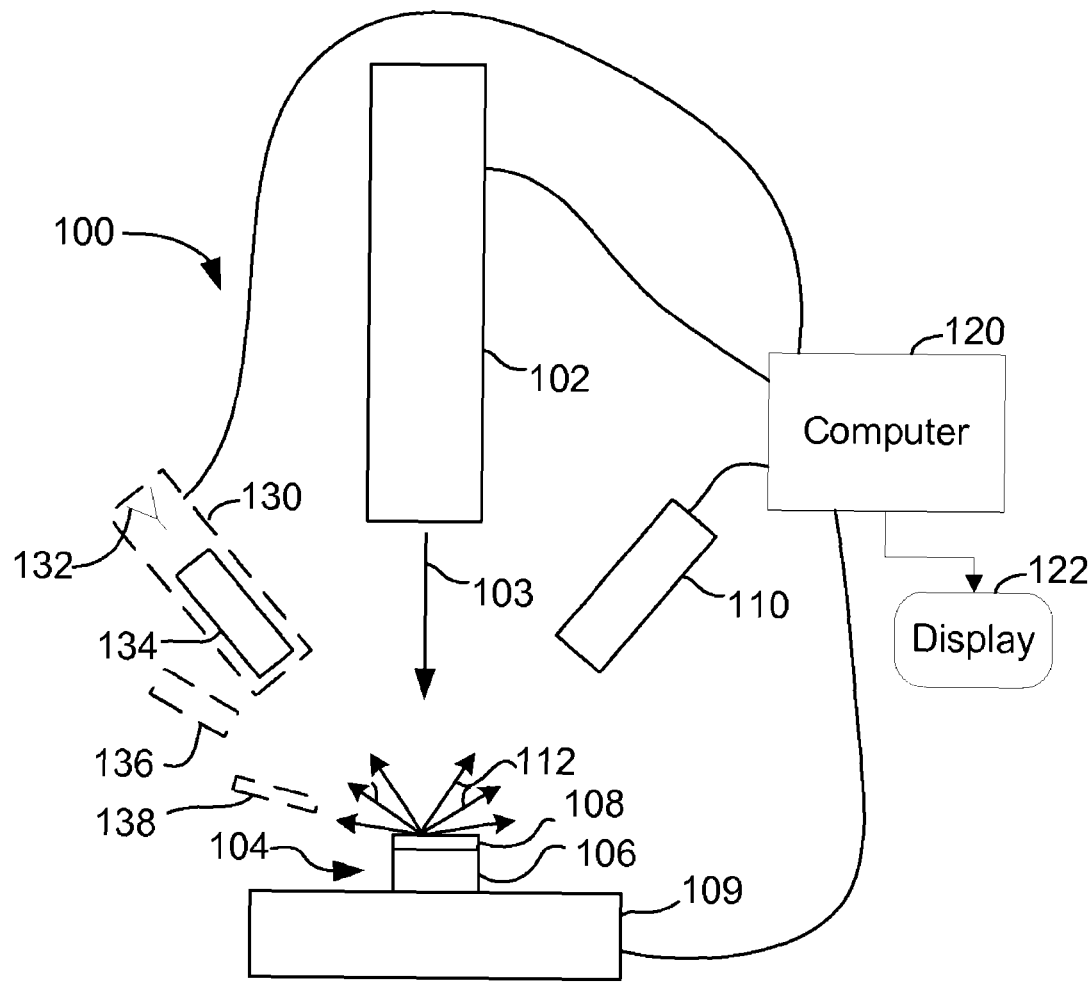
FIG. 1 shows a beam system for use with the present invention.

FIG. 1 shows a system 100 for use with a preferred embodiment of the present invention. A laser 102 directs a beam 103 to a sample 104, which includes a substrate material 106 and a mask 108. The mask may be fabricated by any suitable method, such as by charged particle beam-induced deposition. Laser 102 is preferably capable of being operated at a fluence greater than the ablation threshold of the material being machined. Sample 104 is typically positioned on a precision stage 109, which preferably can translate the sample in the X-Y plane, and more preferably can also translate the work piece in the Z-axis, as well as being able to tilt and rotate the sample for maximum flexibility in fabricating three dimensional structures. System 100 optionally includes one or more charged particle beam columns 130, such as an electron beam column, an ion beam column, or both, which can be used for depositing mask 108 or for other processing or imaging task. Charged particle beam 130 typically includes a source 132 of charged particles; a focusing column 134 for forming a beam of charged particles from the source of charged particles and for focusing and scanning the beam of charged particles onto the substrate surface; a secondary particle detector 136, typically a scintillator-photomultiplier detector, for forming an image of the sample 104; and a gas injection 138 system for supplying a precursor gas that reacts in the presence of the charged particles beam.

When charged particle beam column 130 or secondary particle detector 138 are used, the substrate is maintained in a vacuum. In some embodiments, an additional detector 110 detects emissions 112, such as x-rays or other photons from the sample 104 to determine when a machining process is complete. The emissions 112 change as the mask 108 or the substrate material 106 is removed or uncovered. Such endpointing processes are described in U.S. Pat. App. No. 61/079,304 for Jul. 9, 2009 for "Method and Apparatus for Laser Machining," which is hereby incorporated by reference. A computer 120 controls the system 100 and a display 122 displays an image of the sample for the user.

Figure 2:
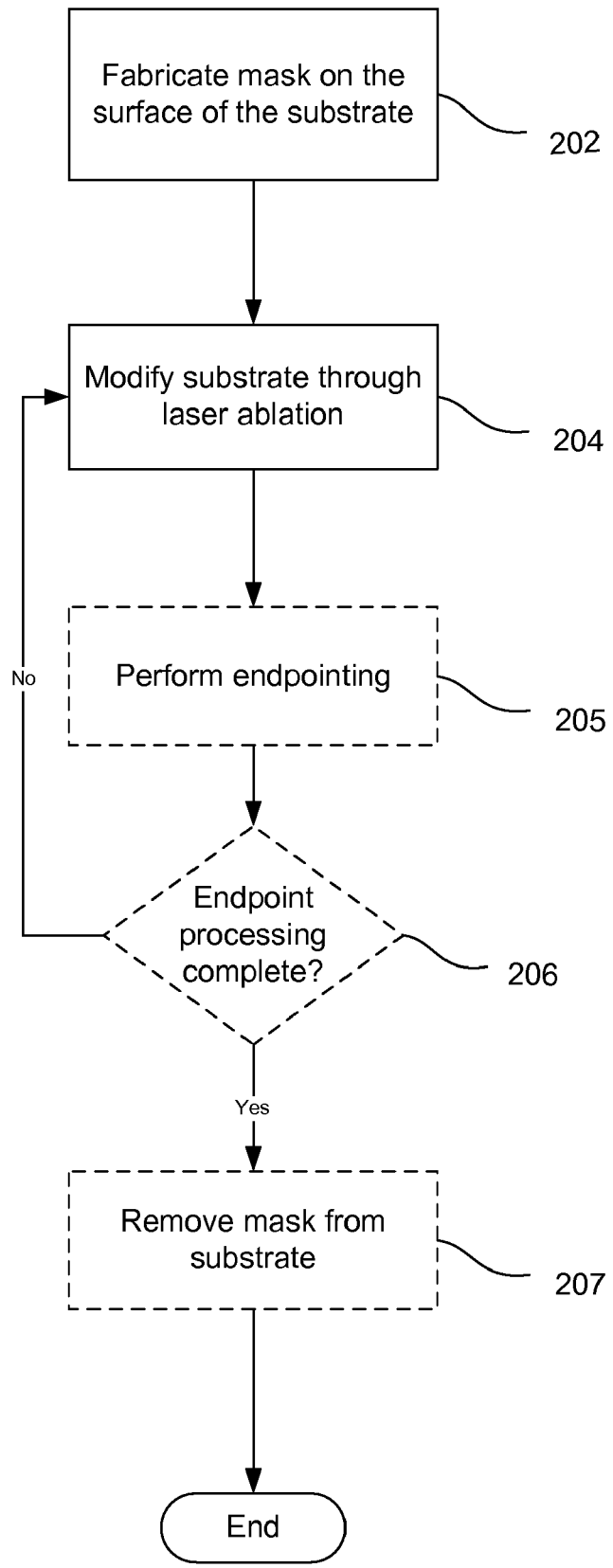
FIG. 2 is a flowchart of the steps of the preferred embodiment of the present invention.

FIG. 2 is a flow chart that shows the steps of a preferred embodiment of the present invention. In step 202, a mask is created on the surface of the substrate using, for example, an additive or reductive technique. In the former case, the mask material is deposited directly to the substrate surface in the desired pattern, for example, using e-beam or FIB induced deposition. Reductive methods involve the global application of a mask material, which is subsequently patterned, for example, by removing material using a FIB or electron beam etching or photolithography. Other techniques that can be used to form a mask include, for example, electro deposition onto a conductive pattern deposited, for example, using charged particle beam deposition or photolithography. The mask is preferably fabricated directly on the surface of the substrate to improve lateral resolution and aspect ratio of features to be machined by the subsequent laser ablation process.

In a mask applied directly onto the work piece, the mask material preferably has an ablation threshold higher than that of the substrate material to be micromachined. In addition, the optical transmissivity of the mask is preferably sufficiently low so as to prevent damage to the underlying substrate through the mask. That is, the mask material is preferably not transparent to, and preferably reflects, the incident laser radiation and not affected by it. Mask transmittance is controlled by both the composition and thickness of the masking material. While it is desirable that the mask be unaffected by the laser, in some embodiments, the mask is affected by the laser, but is sufficiently robust to prevent damage to the substrate during the micromachining operation.

Preferred embodiments include creating a mask that comprises a "graded" structure, that is, a mask with varying degrees of thicknesses, materials, densities or other properties that influence the amount of optical transmission in different areas of the mask. The mask properties are preferably such that the mask is not removed by the laser processing or, if the mask is removed by the laser processing, it is removed at a sufficiently slow rate so that the substrate under the mask is protected until the processing of the unprotected substrate is completed. The mask properties can be controlled to create three-dimensional structures. For example, the mask may have different thicknesses or be made of different materials in different areas, so that portions of the mask are removed by the laser after a period of micromachining, which then allow the substrate under those mask portions to be processed, so that areas that become exposed after the processing has begun are processed less than areas that had no mask at the beginning of the processing.

In one preferred embodiment, the mask is fabricated as described in U.S. patent application Ser. No. 11/766,680, titled "High Resolution Plasma Etch," which is assigned to FEI Company of Hillsboro, Oreg., the assignee of the present invention, hereby incorporated by reference. As described in U.S. patent application Ser. No. 11/766,680, a focused beam having a beam diameter preferably in the range of 1 nm to 100 μm, and more commonly in the range of 1 nm to 10 nm, is used to fabricate a protective layer to mask a portion of the substrate surface. This charged particle beam method typically produces higher definition protective layers than are available through photolithographic means. The charged particle beam can be used to deposit the mask using charged-particle beam deposition, or to pattern a layers previously deposited using a process such as sputtering, plasma deposition, chemical vapor deposition, physical vapor deposition, or pouring a liquid mask material onto a spinning substrate, as is typically done with applying photoresist. The beam processes as described therein create precisely defined protective mask patterns on a substrate surface. For example, beam deposition can produce surface features such as line widths of less than about 10 nm.

A method for electron beam-induced deposition is described, for example, in U.S. Pat. No. 6,753,538 to Musil, et al. entitled "Electron Beam Processing," which is herein incorporated by reference. Musil describes using an electron beam to deposit material by inducing a chemical reaction in a precursor gas that decomposes in the presence of the electron beam to leave an appropriate material on a surface. Preferable deposition precursor gasses include, for example, styrene ($C_6H_5CH=CH_2$) for depositing a carbon protective mask, and $WF_6$ (tungsten hexafluoride) or $W(CO)_6$ (tungsten hexacarbonyl) for depositing a tungsten-rich protective mask that is resistant to oxygen-based carbon etch precursors such as $H_2O$. Precursor gases that result in the deposition of an oxide layer include, for example, TEOS (tetraethylorthosilicate), which deposits a silicon oxide protective mask. Other precursors for electron beam deposition are known and can be used as well. Examples include perdeuterated gallium azide ($D_2GaN_3$) and $Pt(PF_3)_4$ (tetrakis(trifluorophosphane) platinum) for the deposition of masks rich in GaN and Pt, respectively.

Alternatively, an ion beam can be used to deposit material forming the protective mask. In an ion beam deposition process, a gas is directed toward a surface and a finely focused or a defocused ion beam, typically comprising gallium ions from a liquid metal gallium ion source, decomposes gas molecules absorbed on the substrate surface, causes nonvolatile decomposition products to be deposited. A process for depositing metal material using a FIB is described, U.S. Pat. No. 4,609,809 to Yamaguchi, et al. for "Method And Apparatus For Correcting Delicate Wiring of IC Device," which describes the use of a tungsten precursor gas compound in the presence of the FIB to deposit tungsten upon a substrate surface. Other precursor gases that decompose in the presence of a FIB to deposit a material and can be used with the invention are described, for example, in *Handbook of Charged Particle Beam Optics*, Ed. Jon Orloff, CRC Press (1997). The ion beam can be focused to a point or shaped, as described for example, in U.S. Pat. No. 6,977,386 for "Angular Aperture Shaped Beam System and Method" to Gerlach et al., which patent is assigned to the assignee of the present invention. The term "focused beam" as used herein includes a shaped beam.

In step 204, a laser beam is directed toward the substrate at an area to be micromachined and the substrate is modified through laser ablation. The ablation threshold is an intrinsic property of the substrate material, and skilled persons can readily determine empirically or from the literature the ablation threshold for various materials. A silicon substrate, for example, has a single pulse ablation threshold of about 170 $mJ/cm^2$, and so the laser fluence should preferably be just above this value for micromachining silicon in accordance with the invention. A preferred laser beam has energy in the range of 10 nJ to 1 mJ, and a fluence in the range of 0.1 $J/cm^2$ to 100 $J/cm^2$. In one preferred embodiment for milling a silicon substrate, the laser beam has a fluence of 150 $mJ/cm^2$, a pulse duration of 150 fs, and a spot size of 2 Mm. In another embodiment, a laser beam has an energy of 30 nJ and a fluence of 0.4 $J/cm^2$.

Embodiments of the invention could use any type of laser, now existing or to be developed, that supplies sufficient fluence. A preferred laser provides a short, that is, nanosecond to femtosecond, pulsed laser beam. Suitable lasers include, for example, a Ti:Sapphire oscillator or amplifier, a fiber-based laser, or a ytterbium or chromium doped thin disk laser.

An "endpointing" process, such as one of the processes described in U.S. Pat. App. No. 61/079,304 is optionally used to determine whether or not the micromachining is completed. For example, if the laser is being used to uncover a buried material, a change in the emissions can be used to indicate that the laser micromachining has cut through, or nearly cut through, the covering material. If a change in the emissions indicates that the laser micromachining has cut through, or nearly cut through, the covering material or mask, then the process is altered, for example, by stopping the laser beam, changing a laser's parameters, such as the fluence per pulse, changing a gas flow, blanking an electron or an ion beam, or moving a stage that supports the sample. Emissions can be monitored continuously or periodically. If emissions are monitored periodically, the period should be sufficiently small to prevent unacceptable damage to the underlying material if the covering material is completely removed between monitoring periods. In some embodiments, a charged particle beam, such as an electron beam, can be used to generate an endpointing signal for laser micromachining. The electron beam could be, for example, coincident with the laser beam during laser ablation and used concurrently or sequentially with the laser beam. If cathodoluminescence or backscattered electrons are used as the endpointing signal, the electron beam energy can be adjusted to tune the "look-ahead" capability of the endpointing. Decision step 206 determines if micromachining is complete, either by imaging the work piece, observing emissions or determining that a predetermined amount of time has passed, or that a predetermined amount of laser energy has been delivered. If it is not complete, the process could optionally continue with step 204.

Optional step 207 includes removing the mask, for example, using a wet or dry etch process that selectively etches the mask and leaves the substrate substantially unaffected. To this end, the masking material is preferably etched such that it can be selectively removed. For example, if the substrate is made of Si or $SiO_x$ and the mask is made of a carbon compound, then the mask can be removed using an ex-situ delocalized selective chemical etch including, for instance, a "piranha" wet etch process or an oxygen plasma dry etch process to selectively remove the carbon mask without damaging the underlying $SiO_x$. A piranha etch typically includes a mixture of 98% $H_2SO_4$ (sulfuric acid) and 30% $H_2O_2$ (hydrogen peroxide) in volume ratios of 2-4:1, the mixture so-named because of its voracious ability to remove organics, typically in preparation of subsequent use of HF for etching. Fluorinated gas plasmas, such as $SF_6$, $CHF_3$ and $CF_4$ mixed with oxygen are also known to selectively etch a tungsten mask over a silicon substrate on the order of about 2.4:1 and are considered for this step 206 where appropriate materials are used as discussed above. Conversely, if the mask material is $SiO_x$ and the substrate is silicon, then HF wet etch or buffered oxide etch may be used to selectively remove the mask. Appropriate gas mixture ratios using fluorocarbon gases such as $CF_4$ and $CHF_3$ blends may be used to dry etch $SiO_x$ preferentially with substantial selectivity to the exposed silicon.

Figure 3A:
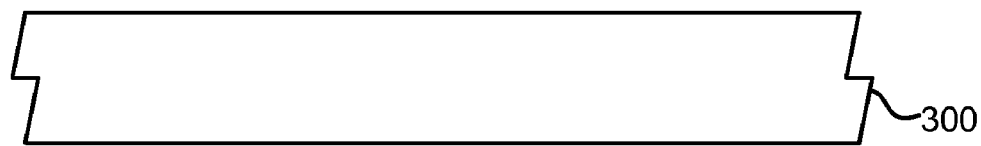
FIG. 3A shows a cross sectional view of a sample substrate to be modified in accordance with the preferred embodiment of the present invention.
Figure 3B:
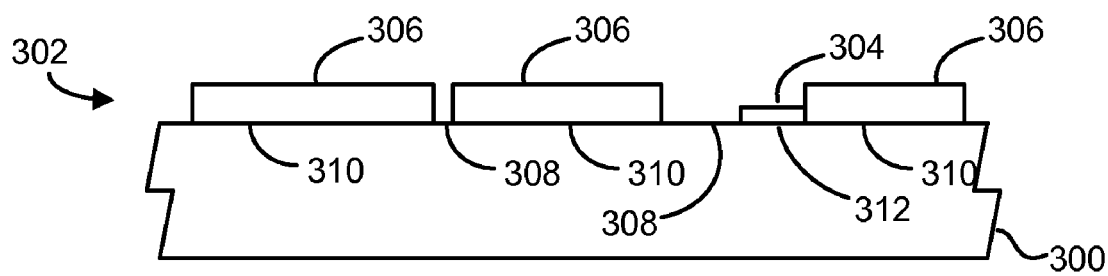
FIG. 3B shows the substrate of FIG. 3A with a portion of a mask deposited thereon.
Figure 3C:
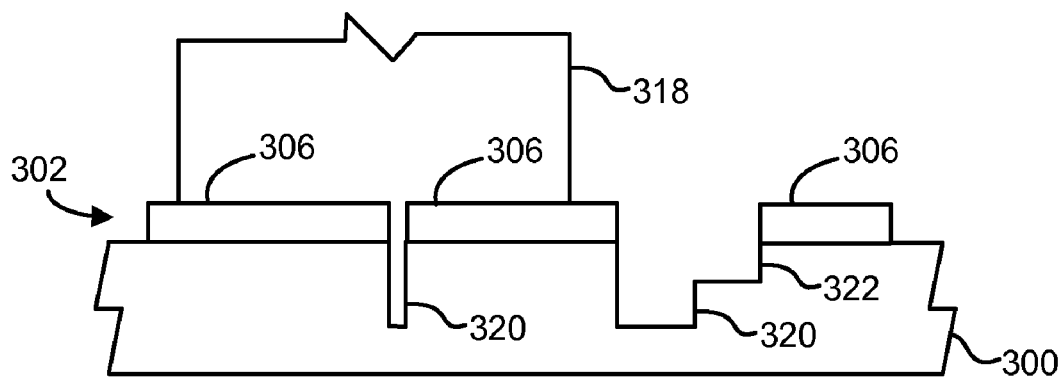
FIG. 3C shows laser ablated regions of the sample substrate.
Figure 3D:
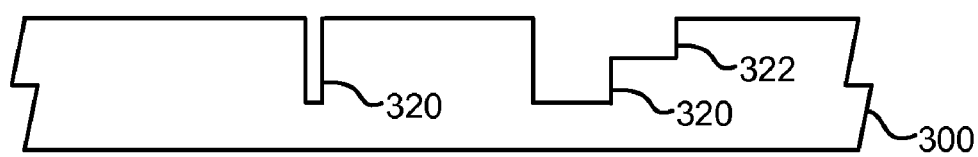
FIG. 3D shows the processed substrate with the mask removed.

FIGS. 3A through 3D illustrate the results of the steps of the flowchart of FIG. 2. FIG. 3A shows the substrate 300 to be processed. FIG. 3B shows the result of step 202, in which a portion of a mask 302 is deposited onto the substrate 300. Mask 302 has portions 304 that are subject to machining by the laser and portions 306 that are sufficiently robust to protect the substrate during the entire laser machining step. Substrate 300 includes unmasked regions 308, masked regions 310 covered by mask portions 306, and a masked region 312 covered by mask portion 304, which only partly protects the substrate during processing. FIG. 3C shows the result of the process of step 204, in which laser 318 has machined holes 320 to a predetermined depth at unmasked regions 308 and has machined a hole 322 to a predetermined depth less than that of region 308 at region 312. Portions 306 of mask 302 are essentially undamaged by the laser beam and the underlying substrate areas 310 are intact. The diameter of laser beam 318 is larger than the diameter of holes 320 and hole 322 demonstrating the production of features having a higher resolution than that of the laser beam. In the embodiment shown, laser beam 318 is scanned from the position shown in FIG. 3C to the right in order to machine the other hole 320 and hole 322. Alternatively, a broader beam could be used that machines both holes 320 and hole 322 without scanning. The beam diameter is preferably sufficiently small to provide sufficient fluence to ablate the substrate material. FIG. 3D shows the result of optional step 207, in which the mask is selectively removed from the substrate.

Figure 4:
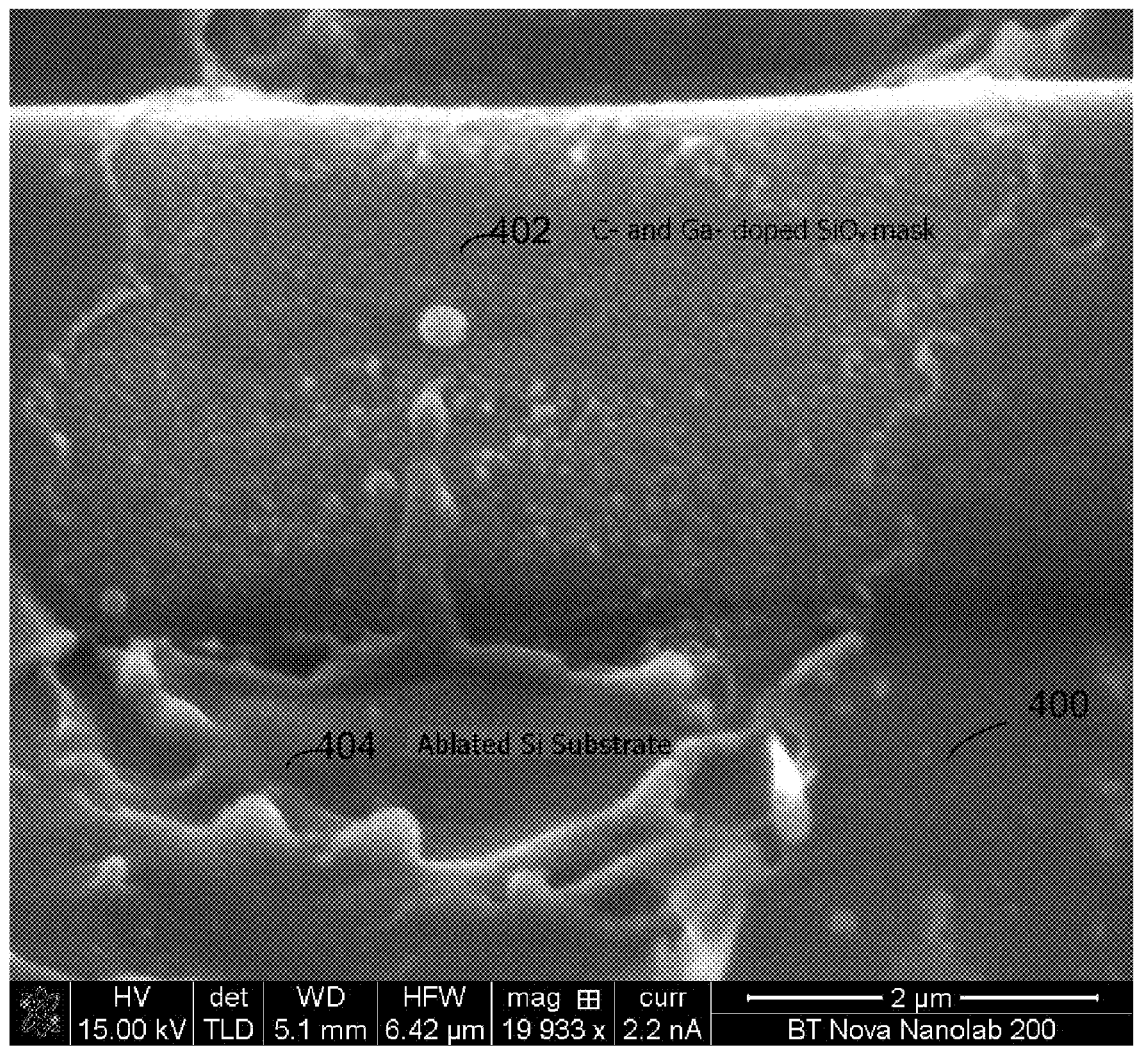
FIG. 4 is an image of a result of the method of a preferred embodiment of the present invention, showing a C- and Ga-doped $SiO_x$ mask via FIB and a [$TEOS+H_2O$] deposition precursor onto a silicon substrate, with subsequent machining with a focused beam of an ultra-short pulse laser.
Figure 5:
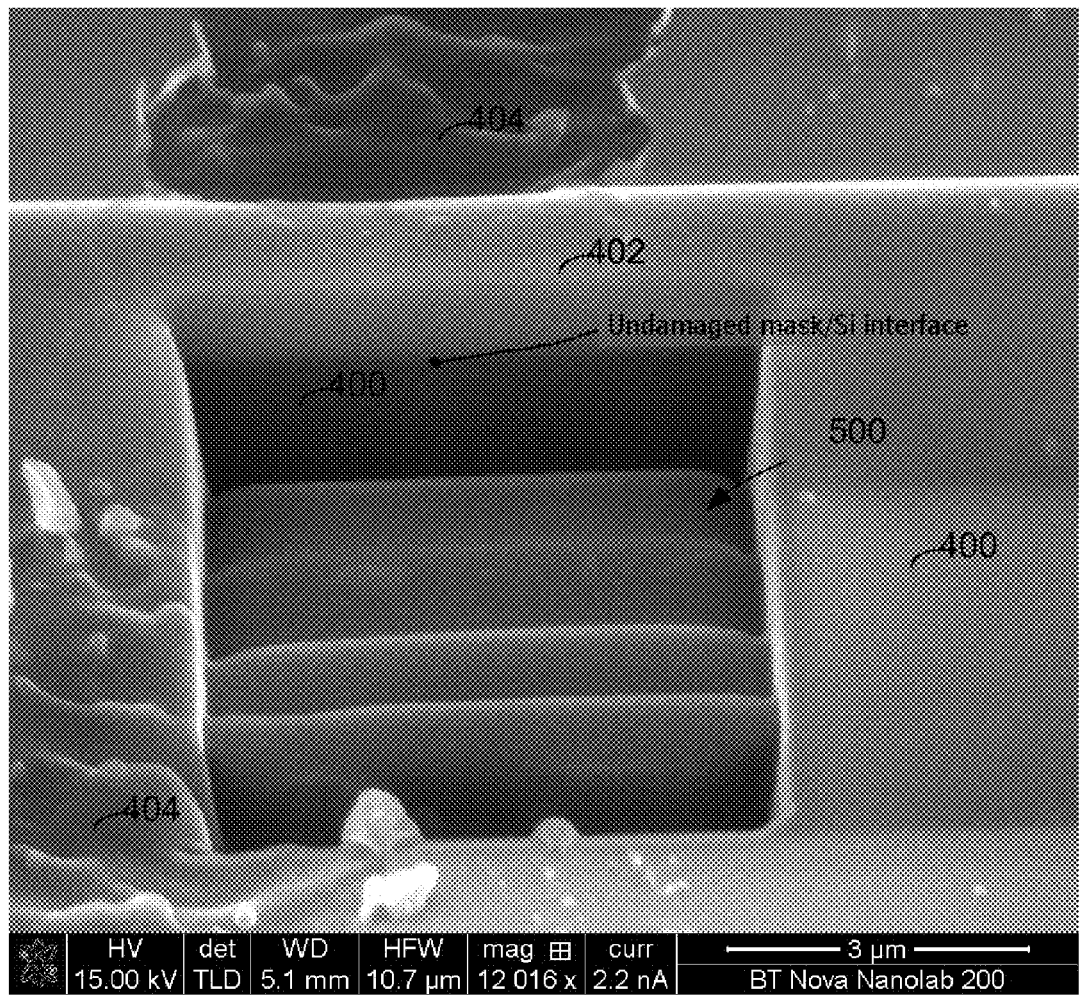
FIG. 5 is an image of the result of FIG. 4, further showing a cross-sectioned portion to reveal the lack of damage by the laser ablation to the underlying silicon substrate.

FIGS. 4 and 5 show results from an experiment in accordance with a preferred embodiment of the present invention, in which C- and Ga-doped amorphous $SiO_x$ mask lines 402 were deposited onto a silicon substrate 400 by a FIB and a deposition precursor composed of a mixture of TEOS and water vapor. A focused beam of an ultra short pulse (USP) femtosecond laser was then used to ablate lines 404 across the mask lines 402. FIG. 5 in particular shows a C- and Ga-doped $SiO_x$ mask line 402 cross-sectioned 500 to reveal no damage to the underlying Si substrate 400 by the laser ablation process. It is noted that the laser-machined lines 404 seen in FIGS. 4 and 5 show pronounced thermal damage that is much greater than that characteristic of optimized, near-threshold micromachining. The excess damage is useful for illustrating the effectiveness of the masking technique by cross-sectional imaging in a dual beam system (rather than by TEM of the mask-substrate interface).

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable.

While the use of a mask has been described with laser ablation using an ultrafast pulsed laser, a mask can also be used to improve the resolution for other types of laser processing as in, for example, photochemical processing, in which the mask shields the substrate from the laser energy or from contact with an etchant chemical. In heat-induced laser reactions, the mask can prevent reaction at the substrate by either causing the reaction on the mask, which can later be removed, or by shielding the substrate from the reactant. The mask can also be used with a laser deposition process, for example, by either depositing material onto a mask, which is later removed, or by using a transparent mask which prevents the reactant from reaching the heated substrate.

In some embodiments, a mask may also be fabricated on a substrate other than the work piece, such as a quartz substrate, and placed in contact with the work piece. A mask could also be placed so that the work piece is within the near-field of the mask, that is, less than about a wavelength from the work piece. A separate contact or proximity mask is not preferred because the ablated material is likely to deposit onto the mask. A mask may be positioned further from the work piece, and then the laser transmitted through or reflected from the mask onto the work piece to ablate material from the work piece surface.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of forming a microscopic or nanoscopic structure on a substrate using a laser beam, the laser having a spot size, comprising:

depositing a mask pattern on the substrate using charged particle beam-assisted deposition, the charged particle beam having a sub-micron spot size and the mask protecting portions of the substrate that are covered by the mask; and directing an ultra-fast pulsed laser beam toward the substrate surface, the laser beam having a spot size that is larger than the spot size of the charged particle beam, the laser beam processing a portion of the substrate that is not covered by the mask to produce features in the substrate, the features produced in the substrate having a dimension smaller than the laser spot size.

2. The method of claim 1 in which depositing a mask pattern on the substrate using charged particle beam-assisted deposition includes providing a precursor gas at the substrate surface and directing a focused ion beam or a focused electron beam toward the substrate surface to dissociate the precursor gas and deposit a masking material.

3. The method of claim 2 in which directing an ultra-fast pulsed laser beam toward the substrate surface includes directing toward the substrate an ultra-fast pulsed laser beam having sufficient fluence to ablate the substrate material.

4. The method of claim 1 in which depositing a mask pattern on the substrate surface includes depositing a pattern that absorbs sufficient laser radiation to prevent damage from the laser beam to the substrate under the mask.

5. The method of claim 1 in which depositing a mask pattern on the substrate surface includes depositing a pattern that reflects sufficient laser radiation to prevent damage from the laser beam to the substrate under the mask.

6. The method of claim 1 in which directing an ultra-fast pulsed laser beam toward the substrate surface includes directing a femtosecond laser or a picosecond laser.

7. The method of claim 1 in which depositing a mask pattern on the substrate surface includes depositing multiple layers of materials to form the mask.

8. The method of claim 7 in which depositing a mask pattern includes depositing a mask pattern in which at least one area of the mask pattern has a property different from that property in other areas of the mask pattern, the different property in the at least one area providing a different level of protection to the substrate to produce different processing of the substrate corresponding to the at least one area.

9. The method of claim 1 in which forming a mask on the substrate surface includes forming a mask using electron beam-assisted deposition or ion-beam assisted deposition.

10. The method of claim 1 in which directing the laser beam toward the substrate surface includes selectively removing the substrate material and leaving mask material to protect masked portions of the substrate.

11. The method of claim 1 in which directing the laser beam toward the substrate surface includes heating a portion of the substrate to initiate a chemical reaction.

12. The method of claim 1 in which directing the laser beam toward the substrate surface includes initiating a photochemical reaction.

13. The method of claim 1 in which directing the laser beam toward the substrate surface includes removing material from the substrate in regions not covered by the mask.

14. A system for fabricating microscopic structures at a substrate surface, comprising:
 a charged particle system, including
  a source of charged particles;
  a focusing column for forming a beam of charged particles from the source of charged particles and for focusing and scanning the beam of charged particles onto the substrate surface; and
  a gas injection system for supplying a precursor gas that reacts in the presence of the charged particles beam;
 an ultrafast pulsed laser column; and
 a computer programmed to direct the charged particle beam in the presence of the precursor gas in a pattern to form a mask on the substrate surface and to direct the laser beam to process unmasked areas of the substrate.

15. The system of claim 14, in which the laser is a femtosecond laser or a picosecond laser.

16. The system of claim 14, in which the computer is programmed to direct the laser beam to process to process masked areas of the substrate.

17. The system of claim 14 in which the charged particle beam and the laser are used within the same vacuum chamber.

18. The method of claim 1 in which depositing a mask pattern on the substrate using charged particle beam-assisted deposition includes depositing a material comprising carbon.

19. The method of claim 1 in which depositing a mask pattern on the substrate using charged particle beam-assisted deposition includes depositing a material comprising oxygen.

20. The method of claim 1 in which depositing a mask pattern on the substrate using charged particle beam-assisted deposition includes depositing a material comprising silicon.

21. The method of claim 1 in which depositing a mask pattern on the substrate using charged particle beam-assisted deposition includes depositing a material comprising an insulator.

* * * * *